United States Patent [19]

Ohm et al.

[11] Patent Number: 4,471,313

[45] Date of Patent: Sep. 11, 1984

[54] DEMODULATOR FOR PHASE DIFFERENCE DEMODULATED SIGNALS

[75] Inventors: Gerhard Ohm; Michael Alberty, both of Backnang; Dietmar Rosowski, Aspach, all of Fed. Rep. of Germany

[73] Assignee: Licentia Patent-Verwaltungs-GmbH, Frankfurt am Main, Fed. Rep. of Germany

[21] Appl. No.: 315,642

[22] Filed: Oct. 27, 1981

[30] Foreign Application Priority Data

Oct. 28, 1980 [DE] Fed. Rep. of Germany ....... 3040506

[51] Int. Cl.³ .............................................. H03D 3/08
[52] U.S. Cl. .................................... 329/112; 329/116; 329/119; 329/137; 329/145; 329/204; 329/205 R; 455/214
[58] Field of Search ............... 329/112, 116, 119, 137, 329/145, 204, 205; 455/214, 337

[56] References Cited

U.S. PATENT DOCUMENTS 3,320,540 5/1967 Ogi et al. ............................ 329/116
3,480,869 11/1969 Hubbard ............................. 329/112
3,881,157 4/1975 McLaughlin ....................... 329/116
4,281,293 7/1981 Childs et al. ....................... 329/112

Primary Examiner—John S. Heyman
Attorney, Agent, or Firm—Spencer & Frank

[57] ABSTRACT

In a demodulator for demodulating a phase difference modulated microwave frequency signal, which demodulator includes a time delay element, a phase shifting unit connected in series with the time delay element, the series arrangement of the time delay element and phase shifting unit being connected to conduct the phase difference modulated signal, and two phase detectors each having one input connected to directly receive the phase difference modulated signal and its other input connected to receive that signal after it has passed through the time delay element and phase shifting unit, each phase detector includes two high sensitivity diodes having their outputs isolated from one another and two separate operating resistors each connected to only a respective one of the diodes, and the time delay element is constituted by a low loss waveguide filter.

3 Claims, 4 Drawing Figures

DEMODULATOR FOR PHASE DIFFERENCE DEMODULATED SIGNALS

BACKGROUND OF THE INVENTION

The present invention relates to a demodulator for phase difference modulated signals in the microwave frequency range, of the type including phase detectors each having one input connected to directly receive the phase difference modulated signal and its other input connected to receive the phase difference modulated signal after it has been conducted through a time delay element and a phase shifter.

Such a demodulator, in the special case for a four-phase difference modulated signal, is disclosed, for example, in the articles by W. H. Childs et al, "An Integrated DQPSK Demodulator for 14 GHz Satellite Communications Applications," IEEE International Microwave Symposium, Ottawa, Canada, 1978, and by T. Shimura et al, "120-Mbit/s, 6 GHz On-Board Waveform Regenerator for Communications," Proceedings of the 9th European Microwave Conference, Brighton, England, 1979.

The basic circuit of a prior art demodulator for a four-phase difference modulated signal (DQPSK) is shown in FIG. 1. The input signal is here divided and delayed in a delay element VG in one branch by one symbol duration T, corresponding to the bit length of the digital signals. The delayed and the undelayed signals are compared with the aid of two phase detectors PD1 and PD2. The delayed signal is fed to the two phase detectors via respective phase shifters $p$, which produce a total phase difference of $\pi/2$ between the two delayed signal components applied to the phase detectors. At the outputs of lowpass filters TP1 and TP2 connected behind the phase detectors, there then appear output voltages which, if the phase setting is correct, correspond to the original modulation signal.

In the construction of the circuit shown in FIG. 1, the delay element VG generally is considered to be a particularly critical component because the delay time T must be absolutely constant. The requirements placed on the delay element become the stricter, the greater is the ratio of signal frequency to bit rate. For a signal frequency of 14.25 GHz and a bit rate of 120 Mbit/s, as for example, in satellite data transmissions, a relative change in the delay time by $10^{-5}$, for example, produces a phase error of almost one degree. It is therefore necessary to employ special measures to effect temperature compensation.

The delay elements described in the applicable literature are either lines, as described in the article by Y. S. Lee and W. H. Childs, "Temperature Compensated BaTi$_4$O$_9$ Microstrip Delay Line"., IEEE International Microwave Symposium, Orlando, Fla., 1979, or in the above-cited article by T. Shimura et al, 120 Mbit/s, 6 GHz On-board Waveform Regenerator for Communications," Proceedings 9th European Microwave Conference, Brighton, England, 1979, or bandpass filters in microstripline form, as described in the article by Y. S. Lee, "14 GHz MIC 16-ns Delay Filter for Differentially Coherent QPSK Regenerative Repeater", IEEE International Microwave Symposium, Ottawa, Canada, 1978. Although these delay elements have a relatively good temperature stability, they also exhibit a rather high degree of attenuation, which in the frequency range of 14 GHz is greater than 20 dB. In order to operate the phase detectors at the necessary signal level, the power of the input signal must therefore be increased. Due to the fact that the delayed signal has a lower power level than the undelayed signal because of the high attenuation of the delay element, there will occur shifts in the zero crossings of the detector characteristic which can be compensated only for one input level at a time.

In order to prevent phase errors due to noncompensated shifts when there are fluctuations in amplitude, it is necessary to connect amplitude limiters ahead of the known demodulators. Amplitude limiters cause a degradation of the demodulator performance which can be compensated only by an increase in the output power of the transmitted signal or by a reduction of the noise figure of the amplifier connected ahead of the demodulator.

If the phase detectors of the known demodulators are to be operated with the same amplitude, the signal distribution ahead of the delay member must be nonuniform. This requires higher input level.

SUMMARY OF THE INVENTION

It is an object of the invention to provide a demodulator for phase difference modulated signals in the microwave range which requires only a low input signal level and which prevents fluctuations occurring in the input signal level from producing phase errors in the phase detectors.

The above and other objects are achieved, according to the invention, in a demodulator for demodulating a phase difference modulated microwave frequency signal, which demodulator includes a time delay element, phase shifting means connected in series with the time delay element, the series arrangement of the time delay element and phase shifting means being connected to conduct the phase difference modulated signal, and two phase detectors each having one input connected to directly receive the phase difference modulated signal and its other input connected to receive that signal after it has passed through the time delay member and phase shifting means, by constructing each phase detector to include two high sensitivity diodes having their outputs isolated from one another and two separate operating resistors each connected to only a respective one of the diodes, and constituting the time delay element by a low loss waveguide filter.

According to a suitable embodiment of the invention the sensitive diodes of the phase detectors are zero bias Schottky diodes and the waveguide filter is made of a ferronickel of the type sold under the trademark INVAR.

The invention will now be explained in greater detail with the aid of an embodiment which is illustrated in the drawing figures.

DESCRIPTION OF THE PREFERRED EMBODIMENTS

Figure 1:
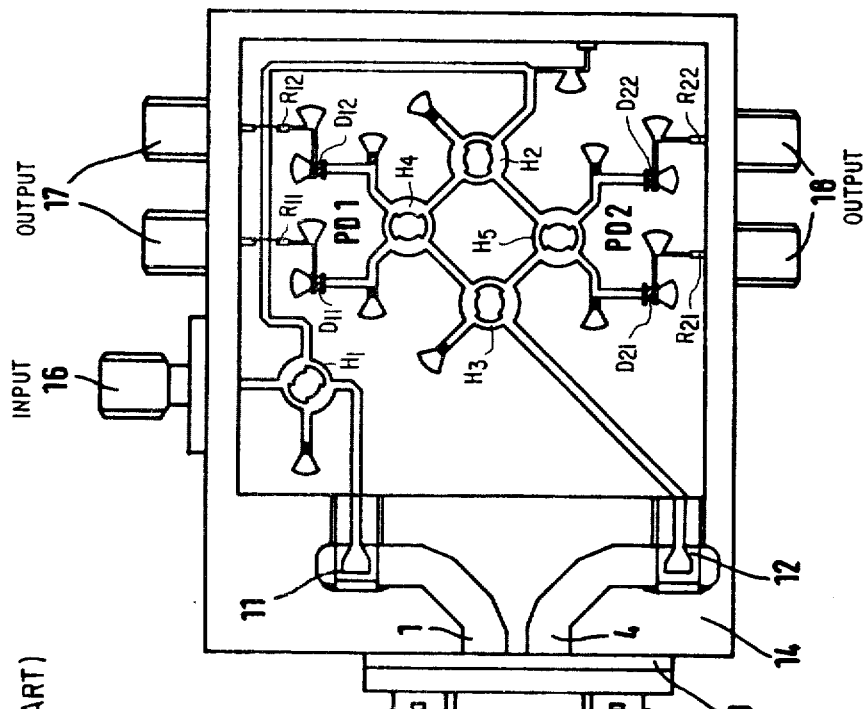
FIG. 1 is a block circuit diagram for the conventional DQPSK demodulator and has already been described above.

The basic circuit of a prior art DQPSK demodulator has already been described above with reference to FIG. 1. The delay element VG of this demodulator is constituted according to the invention by a waveguide filter because a waveguide has considerably less attenuation than, for example, a conventional delay line or a bandpass filter designed in microstripline form. Thus, due to its very low attenuation, the waveguide filter can keep the difference in level between the delayed and undelayed signals low.

Figure 2:
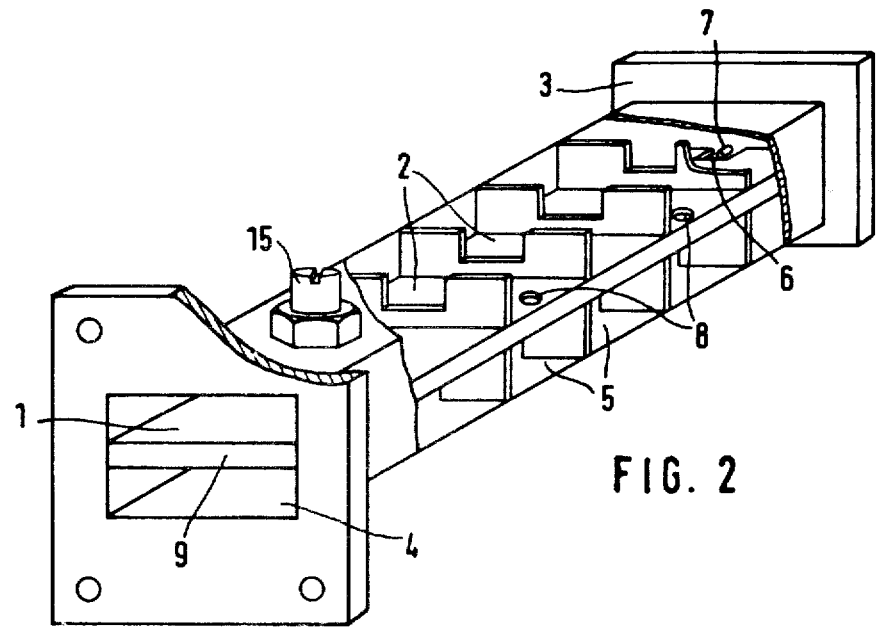
FIG. 2 is a pictorial cut-away perspective view of a preferred embodiment of a waveguide filter constituting a delay element according to the invention.

FIG. 2 shows an embodiment of the waveguide filter for a demodulator according to the invention. This waveguide filter has been folded in order to shorten its structural length, i.e. it presents two waveguide paths connected in series and superposed on one another. An incoming signal enters the upper path 1, passes there through the resonators 2, is coupled, via a coupling opening 6 at the end of this path and before reaching the terminal plate 3, into the lower path 4 where it passes through the resonators 5 and then exits from the waveguide. A screw 7 extends into the coupling opening 6 ahead of the end plate 3 and serves to permit adjustment of the coupling over from one path to the other. Due to the fact that the paths of the waveguide filter are spatially superposed, a coupling between the resonators of the upper path 1 and those of the lower path 4 is also possible through coupling openings 8 in the partition 9. Thus the desired delay behavior of the filter can be selected. To realize a temperature stable time delay, the waveguide filter is manufactured of INVAR.

Figure 3:
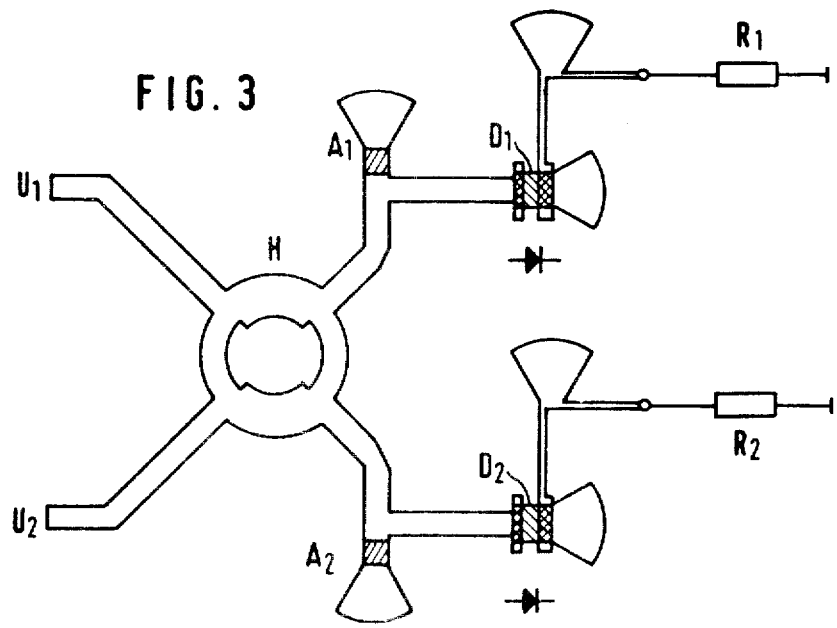
FIG. 3 is a simplified pictorial view of a preferred embodiment of a phase detector according to the invention in microstripline form.

The structure of a phase detector in microstripline form for a demodulator according to the invention is shown in FIG. 3. By means of a ring hybrid H, a delayed signal $U_1$ and the undelayed signal $U_2$ are distributed to the detector diodes $D_1$ and $D_2$. High sensitivity zero bias Schottky diodes are used as the detector diodes. They can be actuated with signals of very low levels. These high sensitivity diodes, however, have the drawback that their current/voltage characteristics can differ very substantially from one diode to the next. For an ideal phase detector, however, diodes are required which have approximately the same characteristics.

Differences between the characteristics of the two diodes can be compensated according to the present invention by isolating the outputs of the two diodes $D_1$ and $D_2$ from one another and connecting those outputs to respective, separate operating resistors $R_1$ and $R_2$ which, under certain circumstances, can be adjustable. By suitable selection of the resistance values of the operating resistors it is possible not only to compensate asymmetries of the diodes but also of other circuit components. For low reflection matching of the diodes over a larger signal amplitude range, absorbers $A_1$ and $A_2$ are each connected in parallel with the leads of a respective diode at a certain distance from the diode. These absorbers serve to minimize reflections which would produce phase errors.

Figure 4:
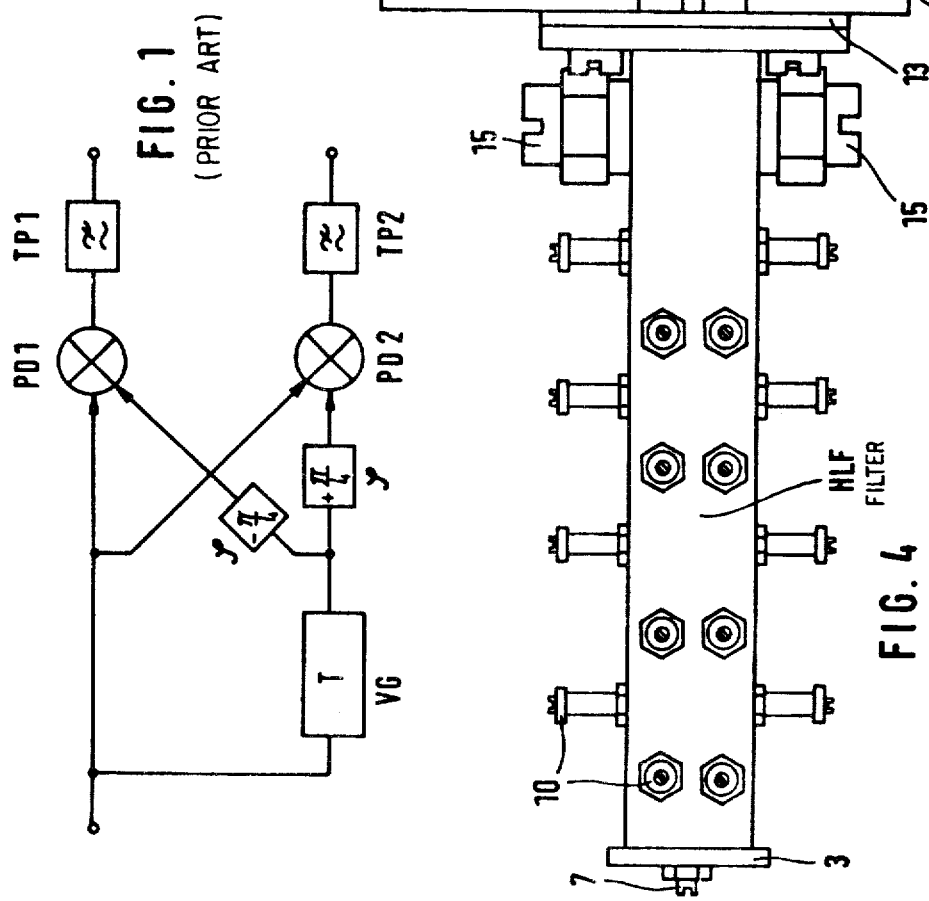
FIG. 4 is a pictorial elevational view of a complete DQPSK demodulator according to the invention.

FIG. 4 shows a complete DQPSK demodulator with the above described waveguide filter HLF, shown in FIG. 2, as the delay element and two phase detectors PD1 and PD2 each having the form shown in FIG. 3. The waveguide filter is provided with a plurality of tuning screws 7 and 10 and is equipped with means, ahead of junctions 11 and 12 between its waveguide paths 1 and 4, and the microstriplines of the phase detectors, to set the required phase difference between the delayed and undelayed signals. Rough setting of the phase is effected by inclusion of spacer 13 between the waveguide filter HLF and the housing 14 of the microstripline circuit. The fine setting of the phase can be effected by means of screws 15 which project into the end of the waveguide filter.

The phase difference of $\pi/2$ between one pair of the phase detectors input ports is realized by proper spacing of the ring hybrids $H_2$, $H_3$, $H_4$, $H_5$.

The DQPSK demodulator shown in FIG. 4 operates as follows:

The signal supplied to input 16 is fed, on the one hand, via ring hybrids $H_1$ and $H_2$ to one input of each of the two phase detectors PD1 and PD2 and, on the other hand, to the path 1 of the waveguide filter HLF.

After the signal has passed through the forward path 1 and the return path 4 of the waveguide filter and thus has been delayed, the delayed signal is also fed to the two phase detectors PD1 and PD2, via a further ring hybrid $H_3$. Phase detector PD1 includes diodes $D_{11}$ and $D_{12}$ and resistors $R_{11}$ and $R_{12}$, while phase detector PD2 includes diodes $D_{21}$ and $D_{22}$ and resistors $R_{21}$ and $R_{22}$. If the phase position of the delayed signal is correct, the demodulated signal is then available at the outputs 17 or 18, respectively, of the phase detectors.

The low loss waveguide filter described here has been designed according to the article by J. D. Rhodes, "The generalized Direct-Coupled Cavity Linear Phase Filter," IEEE Transactions on Microwave Theory and Thechniques, Vol. MTT, 18, No. 6, June 1970, and the filter handbook, by G. L. Matthaei, L. Young, and E. M. T. Jones, "Microwave Filters, Impedance-Matching Networks, and Coupling Structures," New York: McGraw-Hill, 1964, Ch. 8.

The design of microstrip phase detectors is described in detail in the article by G. Ohm, and M. Alberty, "Microwave Phase Detectors for PSK Demodulators," IEEE Transactions on Microwave Theory and Techniques, Vol. MTT 29, No. 7, July 1981.

The zero-bias Schottky diodes used are from ALPHA INDUSTRIES, 20 Sylven road, Woburn, Mass. 01801. The diode type is DDC 45 64 AM.

It will be understood that the above description of the present invention is susceptible to various modifications, changes and adaptations and the same are intended to be comprehended within the meaning and range of equivalents of the appended claims.

What is claimed is:

1. In a demodulator for demodulating a phase difference modulated microwave frequency signal, which demodulator includes a time delay element, phase shifting means connected in series with the time delay element, the series arrangement of the time delay member and phase shifting means being connected to conduct the phase difference modulated signal, and two phase detectors each having one input connected to directly receive the phase difference modulated signal and its other input connected to receive that signal after it has passed through the time delay member and phase shifting means, the improvement wherein: each said phase detector comprises two Schottky diodes having their outputs isolated from one another and two separate resistors each connected to only a respective one of said diodes to compensate for asymmetries of said diodes and other components of said demodulator; and said time delay element is constituted by a low loss, temperature stable waveguide filter.

2. Demodulator as defined in claim 1 wherein each said Schottky diode is a zero bias Schottky diode.

3. Demodulator as defined in claim 1 wherein said waveguide filter is made of a ferronickel alloy.

* * * * *